United States Patent [19]

Hunting et al.

[11] Patent Number: 5,097,213
[45] Date of Patent: Mar. 17, 1992

[54] APPARATUS FOR AUTOMATIC TESTING OF ELECTRICAL AND ELECTRONIC CONNECTORS

[76] Inventors: Curtis J. Hunting, 1808 E. Altadena Dr., Altadena, Calif. 91001; Donald L. Patts, 918 Topeka St., Pasadena, Calif. 91004; Brian J. Hunting, 1808 E. Altadena Dr., Altadena, Calif. 91001

[21] Appl. No.: 527,858

[22] Filed: May 24, 1990

[51] Int. Cl.⁵ .................................... G01R 31/04
[52] U.S. Cl. ............................ 324/538; 324/519; 324/551; 324/158 F
[58] Field of Search ............... 324/538, 539, 519, 527, 324/541, 540, 551, 603, 658, 659, 158 F

[56] References Cited

U.S. PATENT DOCUMENTS

| | | | |
|---|---|---|---|
| 2,762,014 | 9/1956 | Anderson | 324/539 X |
| 3,471,778 | 10/1969 | Bennett et al. | 324/538 |
| 4,320,338 | 3/1982 | Morris et al. | 324/539 X |
| 4,458,196 | 7/1984 | Goyal et al. | 324/603 X |
| 4,472,676 | 9/1984 | Eichmann et al. | 324/603 X |
| 4,835,479 | 5/1989 | Haines | 324/539 X |

Primary Examiner—Kenneth A. Wieder
Assistant Examiner—Robert W. Mueller
Attorney, Agent, or Firm—Pollock, Vande Sande & Priddy

[57] ABSTRACT

An apparatus for automatically testing multipin connectors is disclosed. A carrier frame contains connector cells of different configurations. Multiple groups of pins of the connector are connected together and to a source of high voltage. The resulting leakage current between energized pins and a remaining unenergized pin may be measured and compared with various stored test parameters. When the on-board computer detects a current which does not meet the stored test parameters, an error message is posted and displayed and also passed to a host computer connected to the on-board computer for storage and display.

18 Claims, 12 Drawing Sheets

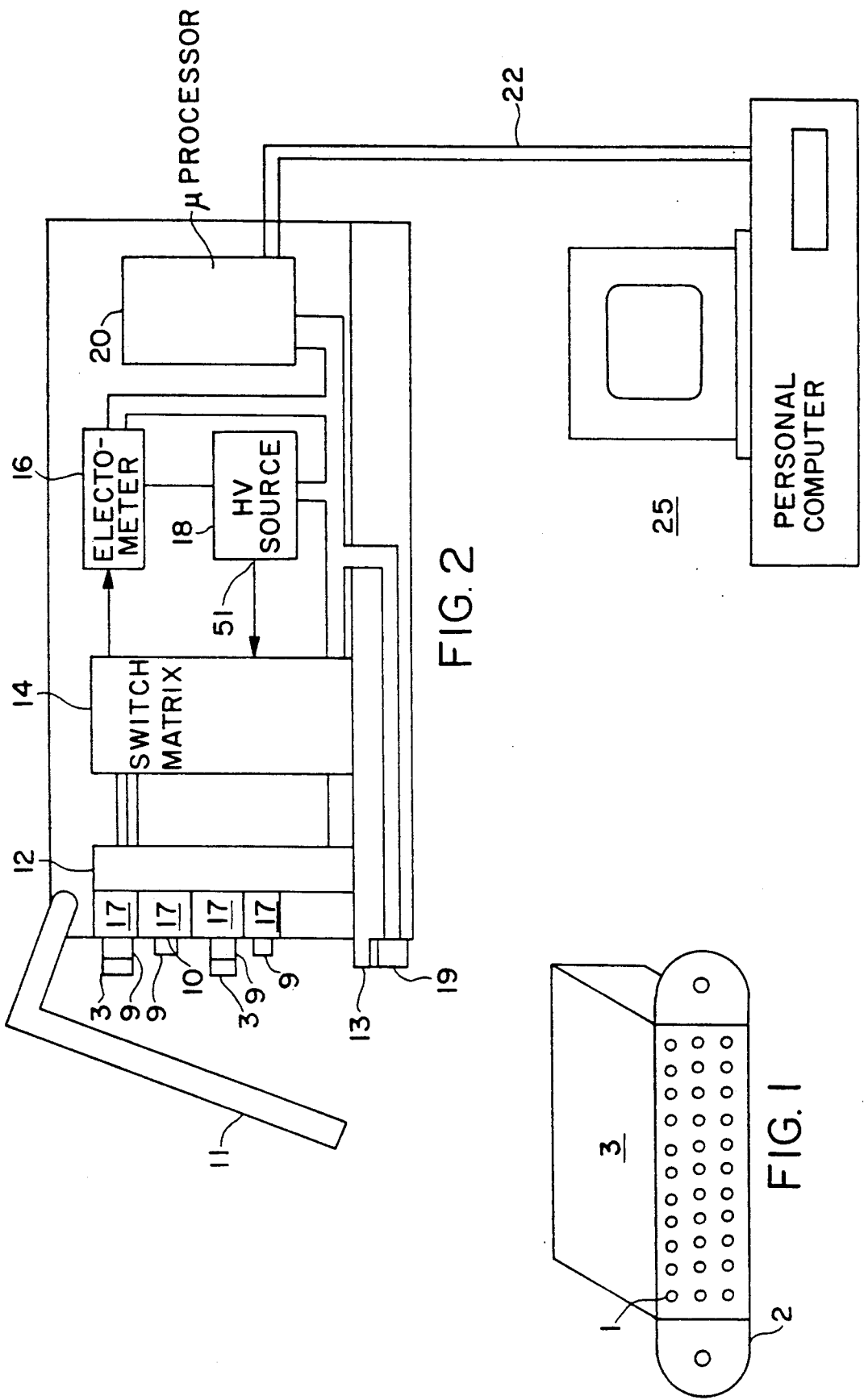

PROMPT #1: TYPE PART NUMBER IN CELL INDICATED
BY CURSOR AND ENTER. TO OMIT A CELL,
HIT ENTER.

| CONN. #1 PART?__ | | | |
|---|---|---|---|
| | | | |

| TEST SEQUENCE | | 2 | | | 1 | | | | | | | | 4 | 3 | |
|---|---|---|---|---|---|---|---|---|---|---|---|---|---|---|---|
| PART# | PIN# | IR VDC | IR MODE | IR DWELL | IR FAIL Mohms | DWV VDC | DWV VAC | DWV FAIL mA | DWV MODE | DWV DWELL | CAP MIN FAIL pf | CAP MAX FAIL pf | CAP MODE | CAP SAMPLE POINT |
| 123456 | | 100 | V | 125 | 2000 | 500 | 0 | 500 | F | 600 | 800 | 1200 | 1V | 0 |

APPARATUS FOR AUTOMATIC TESTING OF ELECTRICAL AND ELECTRONIC CONNECTORS

The present invention relates to the testing of connectors which terminate multiconductor cables. Specifically, a high speed testing apparatus capable of individually testing all pins of a multi-pin connector rapidly and thoroughly is described.

Multi-pin connectors which terminate multiconductor cables are used throughout the electronic industry to provide reliable interconnections between electronic equipment. In certain applications, these interconnecting cables are a source of electromagnetic interference (EMI) and radio frequency interference (RFI) which are conducted across the cables, through the connection, into the equipment. The suppression of EMI which enters through cables or is radiated from cables connecting electronic equipment is remedied by a number of different solutions. Of late, connectors have been manufactured which include a bypass capacitor between each of the pins and the outside ground connection. Typically, a barium titanate ceramic capacitor substrate is provided through which the pin passes. The substrate forms a capacitor between the pin and the outside shell member, thus providing AC bypassing for each of the connector pins.

The reliability of such connectors must be completely verified before using them in many situations. For instance, in military applications, the connectors are individually tested to be certain there are no defects such as leakage between any of the pins, as well as verifying whether such bypass capacitors indeed have the requisite capacity to provide suppression of EMI and RFI signals on the conductors.

The connectors are varied in terms of the number of pins and size such that testing of individual connectors is usually restricted to one particular connector type. The instrumentation used to measure the integrity of each pin and the associated capacitance is time consuming and may require up to 45 minutes of test technician time to manually test a single connector. This methodology clearly has substantial impact on the direct cost of the connector.

Given the foregoing necessity to completely test a multi-pin connector, the present invention has been developed.

SUMMARY OF THE INVENTION

It is an object of this invention to provide for automatic testing of multi-pin connectors.

It is a specific object of this invention to conduct multiple tests on each pin of a multi-pin connector automatically and particularly at speeds that are presently not attainable with existing technology.

It is yet a more specific object of this invention to measure the capacity between each pin of a multi-pin connector and ground, as well as the insulation resistance and dielectric withstanding voltage (DWV) of each pin with respect to ground and to all other pins.

These and other objects of the invention are provided by an apparatus which is capable of individually addressing each pin of a multi-pin connector and conducting multiple tests on that pin.

In carrying out the invention in accordance with a preferred embodiment, a high voltage operational amplifier circuit is provided which will provide a high voltage, low impedance output for rapidly applying a test potential to any number of pins of a connector. An electrometer is provided which is capable of measuring a current flowing between any one pin, and the combined remaining pins of a connector which receives the high voltage.

Using the apparatus in accordance with the preferred embodiment, it is possible to establish high voltage test potentials capable of measuring the insulation resistance (IR) and dielectric working voltage (DWV) of the individual pins of a connector, as well as the capacitance that each pin presents with respect to the remaining connector structure.

A computer display or printout is available to demonstrate the results of testing each of the pins in accordance with capacitance measurements, insulation resistance and DWV measurements.

The device, according to a preferred embodiment, includes a plurality of connector interface cells, each of which will support different types of connectors to the connection of a common switching matrix. The common switching matrix selects a connector and pin of the connector for test. The device is controlled by a single board computer which provides signals to the high voltage operational amplifier circuit to generate the required test voltages, as well as select which group of pins of a connector under test is to receive a high voltage. The voltage applied to the connector pins may be either a steady state DC level, an alternating current signal, or a time varying function. In accordance with the preferred embodiment, during the application of a high voltage ramp potential to a plurality of pins under test and the connector shell, the DC current that is caused to flow, by the application of a linear voltage ramp, between the energized pins and the pin under test is measured with the electrometer to determine a value of capacitance for the pin under test. The DC current in the capacitor under test as a result of applying a linear change in potential dv/dt to the plurality of adjacent pins is related to the capacitance C of the unenergized pin under test with respect to the substrate common as:

$$i = C \frac{dv}{dt}$$

The high voltage is obtained from the high voltage operational amplifier circuit. The high voltage operational amplifier circuit has a low voltage input capable of receiving any type of signal for replicating at a higher voltage. The operational amplifier permits rapid charging of the capacitance associated with a connector pin under test, providing an automatic and high speed determination of the capacity of the pin with respect to a common potential. The computer is capable of generating commands to the high voltage operational amplifier so as to select a desired test voltage which may be either a DC steady voltage or a time varying voltage function. The electrometer is configured by the on-board computer to have a sensitivity range compatible with the expected currents to be measured.

The currents sensed by the electrometer are digitized and forwarded to the on-board computer. These detected currents are compared with previously stored criteria for insulation resistance IR, dielectric working voltage DWV and capacitance C which is determined from the sensed current data.

BRIEF DESCRIPTION OF THE FIGURES

FIG. 1 illustrates a multi-pin connector which may be tested with a device in accordance with the invention.

FIG. 2 is a block diagram of a preferred embodiment of the invention for testing the connector of FIG. 1.

DESCRIPTION OF THE PREFERRED EMBODIMENT

Figure 3:
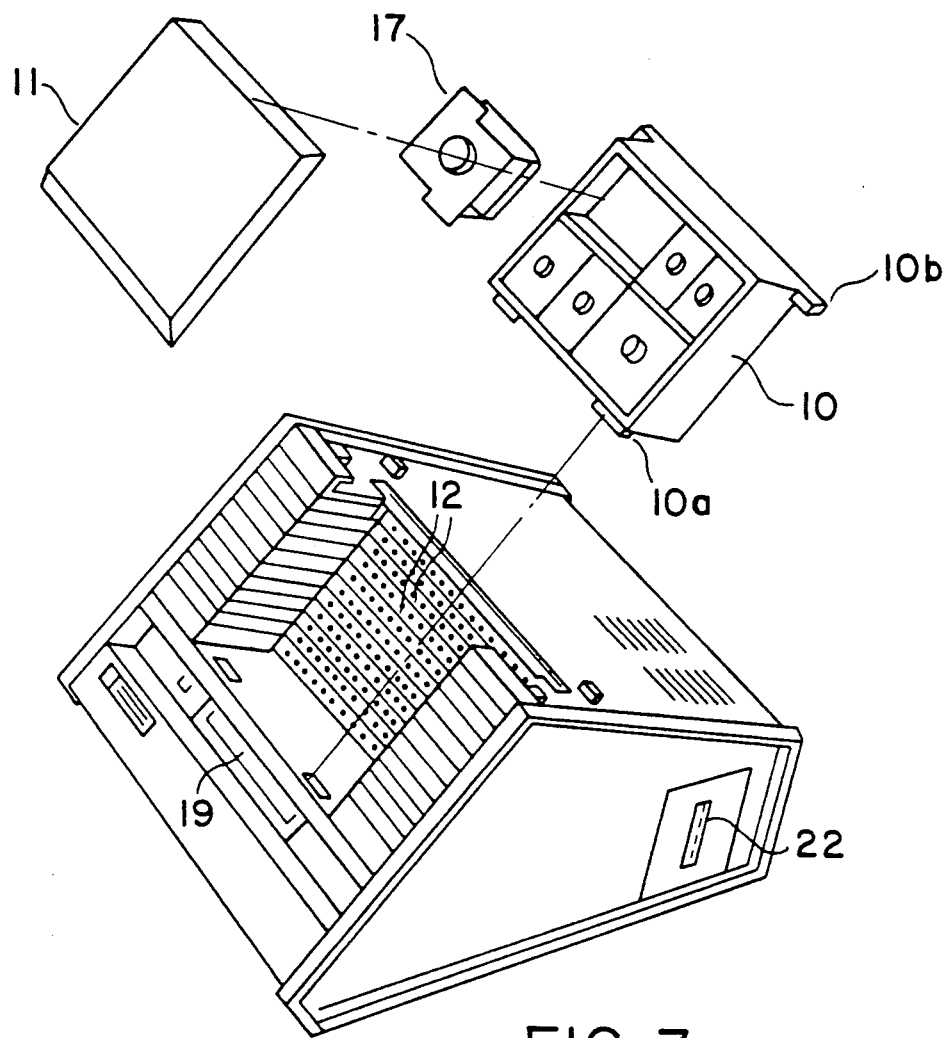
FIG. 3 illustrates a preferred mechanical interface for the testing device of FIG. 1.

FIG. 1 illustrates a typical multi-pin connector having 27 pins for receiving a like number of conductors of a cable. The connector illustrated in FIG. 1 is of the type which includes a monolithic ceramic capacitor substrate internal to the connector, providing a bypass capacitance from each of the illustrated pins 1 to the outside shell 2 of the connector. To thoroughly test connector 3 requires that each of the pins be individually tested so that the insulation resistance (IR), dielectric withstanding voltage (DWV) and capacitance (C) of the pin with respect to the shell 2 and all other pins be measured with speed and accuracy.

Shown in FIG. 2 is a testing device, in accordance with a preferred embodiment of the invention, which will receive the connector 3 in a receptacle 9 mounted to one of a plurality of cells 17. The cells 17 are contained within a replaceable carrier 10 which will interface each pin of a respective connector to a corresponding connection point of a spring contact of a test bed backplane 12 of the assembly of switching matrix modules 14. Replacing cells with different configurations, or replacing different carriers which support different cell configurations permits other types of connectors to be tested.

The carrier 10, once in place, connects each of the pins of a connector 3, receptacle 9 and respective cell 17 to precisely located contacts on the backplane of the test bed 12. The contacts of the backplane of the test bed 12, when touching like spaced contacts of the cell 17, provide a throughpath to a switching matrix 14. The backplane 12 provides a matrix of 32×10 individual points which may be addressed by the switching matrix 14. A cover 11 is shown which closes, once the connector 3 has been inserted in a respective receptacle 9, along with other connectors 3, for testing by the device. The cover 11 avoids any possibility of high voltage inadvertently coming into contact with the operator. A proximity switch 13 disables the generation of high voltage for the device of FIG. 2 when the cover 11 is not in the closed position.

The switching matrix 14 is controlled by address lines connected to the on-board computer 20. The address lines will identify which of the pins of an individual connector is to be connected to the electrometer 16, and which of the pins of a connector is to be connected to a source of high voltage 18. In carrying out the insulation resistance test, in accordance with the preferred embodiment, an individual pin of a connector under test is connected to the electrometer 16, while the remaining pins are connected to the shell 2 of the connector, and receive a high voltage for conducting a test. The carrier 10 is an open frame used to secure and position the cells 17 during testing. Each cell 17 corresponds to a respective connector under test. Shown in FIG. 2 are four receptacles 9, each capable of receiving a connector for test. It is to be understood that the number four is relatively arbitrary, and more (as many as eight) or fewer (one) cells may be provided, the only limitation being the total number of pins for a given connector, which can be addressed by switching matrix 14.

In carrying out the testing of the connectors according to the preferred embodiment, the on-board computer 20 will sequentially apply a high voltage from high voltage source 18 to all but one pin of a connector under test and the shell 2, while sensing the leakage current flowing between the energized pins and the remaining pin. The current flow between the energized shell 2, and the no voltage pin is detected in electrometer 16, which is connected to measure current flowing between the no voltage pin and a common connection of HV voltage source 16, and latched into an analog-todigital converter. The measured current is then available for the on-board computer 20 to access and compare with various stored criteria.

The high voltage source 18 is programmable, receiving data from the on-board computer 20, specifying the magnitude of a voltage potential to be applied on output terminal 51. The high voltage source 18 includes a high voltage operational amplifier having the capability of rapidly charging the connected pins, permitting the connected pins to charge to 1500 volts DC in milliseconds. The high voltage source 18 will generate any particular voltage in any sequence programmable by the operator under control of the on-board computer 20. The high voltage source may produce a steady state DC voltage, a ramping potential or a time varying potential in accordance with any selected function. Thus, the high voltage source 18, when fed an input signal representing a low voltage sinusoidal signal, will produce on its output a high voltage sinusoidal signal for testing where AC voltage may be required.

The results of conducting the test, wherein detected leakage currents are used to compute various test parameters such as insulation resistance, dielectric working voltage and capacitance, by the on-board computer 20, are available via an RS232 C-link 22 to a host computer 25. The host computer 25, through various menu-driven software routines to be explained, will permit configuring of the on-board computer 20 to establish appropriate gain factors for the electrometer 16, permit storage of test result data by part number and particular test conducted, and identify test results for each pin of a given connector under test. As will also become clear, the host computer 25 may tally on a disc file the results of measuring entire batches of connectors to permit quality control analyses to be conducted when connector failures are detected.

The on-board computer 20 has a display 19 associated with it which will identify to the operator a connector failure. The display according to the preferred embodiment identifies which connector cell produced failure along with a pin number for the failed connector which did not pass the testing criteria. Thus, once configured to run a test, the testing device may be used apart from the host computer 25 in a stand along mode to test and identify connectors which fail the testing routine, displaying the results of the test on display 19.

FIG. 3 illustrates a preferred arrangement for testing a multiplicity of connector types interfaced with the automatic testing device. As shown in this Figure, there is a test bed 2 which will receive a carrier 10. The carrier 10 includes first and second pairs 10a, 10b of tabular inserts for holding the carrier in place in the test bed 12. The cover 11 is shown detached from the test bed but as is illustrated in FIG. 2, once in place, enables testing of connectors inserted in socket 9 and mounted by the carrier to commence.

Figure 4:
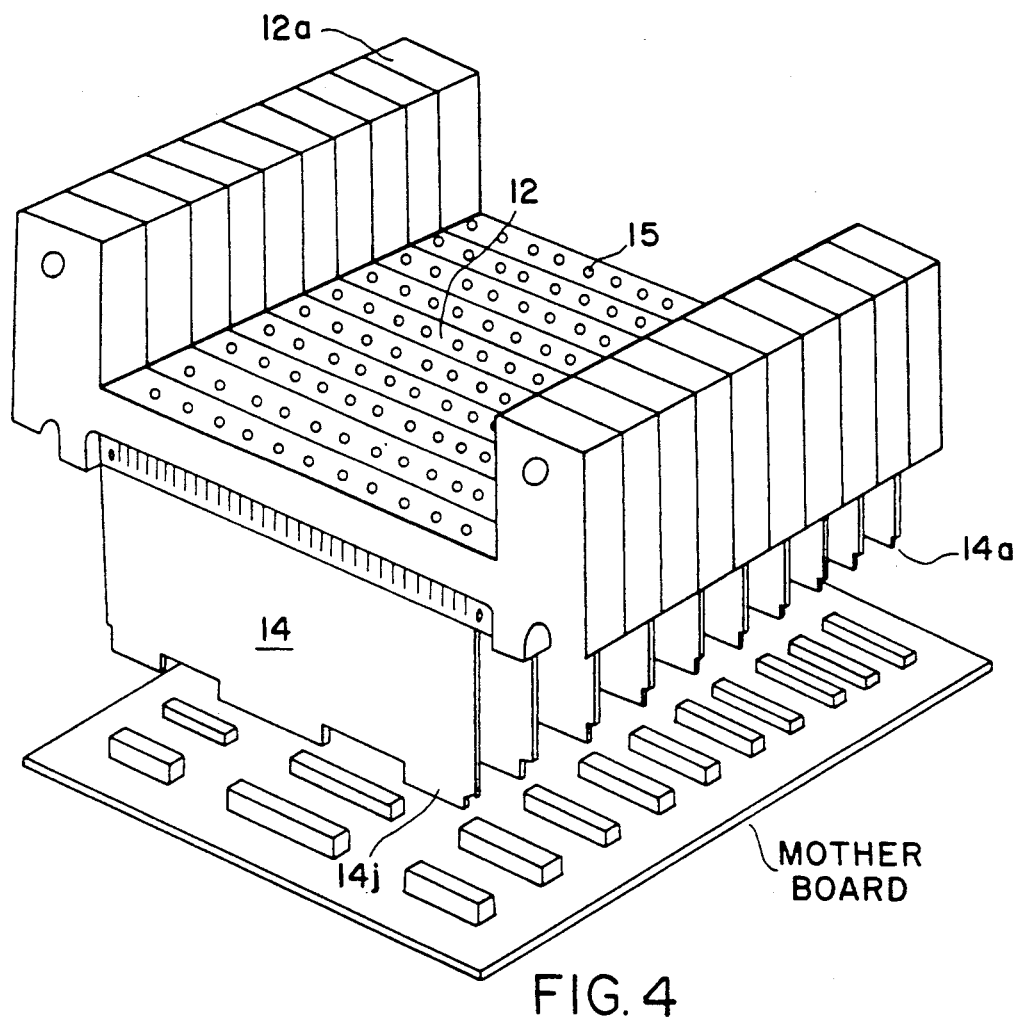
FIG. 4 illustrates the modules which make up the test for the electrical interface to the switching matrix.

FIG. 4 illustrates in greater detail the test bed 12 which comprises a plurality of test bed modules 14. The test bed modules support on one side thereof a plurality of switching matrix devices 14a-14j, shown as individual cards. Each switching matrix device 14a through 14j includes on one side thereof a plurality of spring contact probes 15 which will connect individual switching points of the switching matrix 4 to respective contacts on test cells of an inserted carrier 10. A mother board connects each of the individual switching matrix planes 14a and 14j to connectors for receiving high voltage, address lines and providing a connection for the electrometer.

Figure 5:
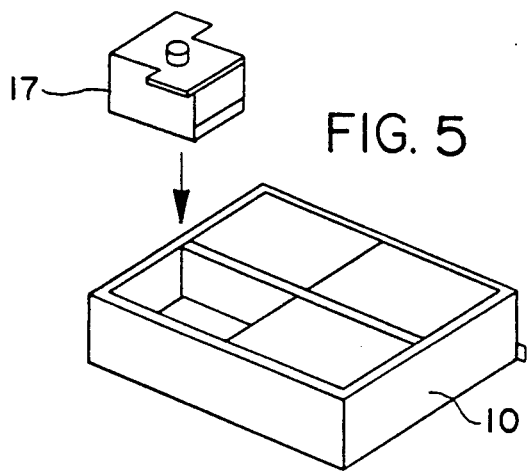
FIG. 5 illustrates the carrier which accepts a plurality of test cells for insertion into the test bed.
Figure 6A:
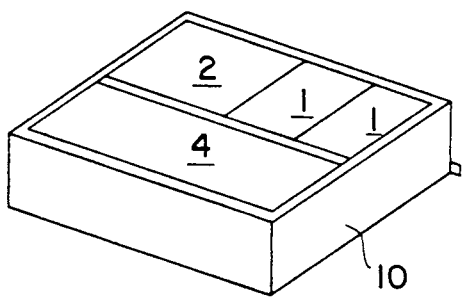
FIG. 6A illustrates one example test cell carrier configuration for the test bed.
Figure 6B:
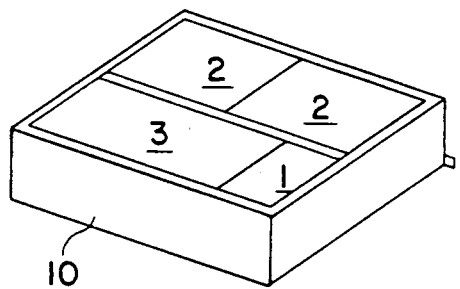
FIG. 6B illustrates a second example test cell carrier configuration for the test bed.

FIG. 5 illustrates in greater detail the test cell carrier 10 which comprises a plurality of openings, each receiving a test cell 17. As shown in FIGS. 6A and 6B, these test cells may be configured in any orientation, depending on the connectors which are to be tested. It is not necessary to have each cell identical, but rather partitioned such that connectors having different numbers of pins may be tested during one test sequence.

Figure 7A:
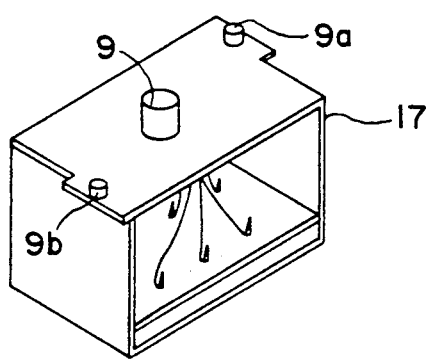
FIG. 7A illustrates a first test cell arrangement for the carrier 10.
Figure 7B:
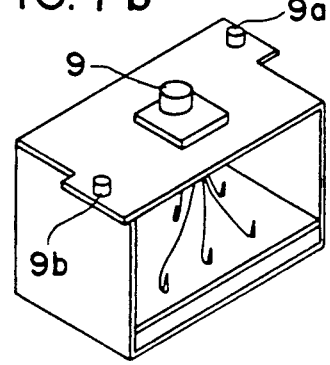
FIG. 7B illustrates a second test cell arrangement for the carrier 10.

Each of the test cells 17 of FIGS. 7A and 7B support on one side thereof a socket 9, and on the other side thereof pin connections 17a. The pin connections and sockets 9 are interconnected by wiring which is spatially fixed, very short (less than 2 inches), and provides only minimal, unmeasurable capacitive loading to each of the connected pin receptacles of socket 9. The test cells 17 are inserted in a respective cell of carrier 10, and held in place by a pair of quarterturn fasteners 9a and 9b.

Using the assembly of test cell 17, carrier 10 and test bed 12, a carrier 10 bearing connector types to be tested may be rapidly inserted, and the capacitance offered by the test set up being minimal and fixed, such that repeatable tests may be made without recalibrating the device to compensate for stray capacitances which might otherwise be present if interconnecting cables, having a varying capacity, are used.

The foregoing arrangement requires minimal operator intervention or skill such that testing of different types of connector arrangements may be effected rapidly, without danger of uncalibrating the device.

Figure 8:
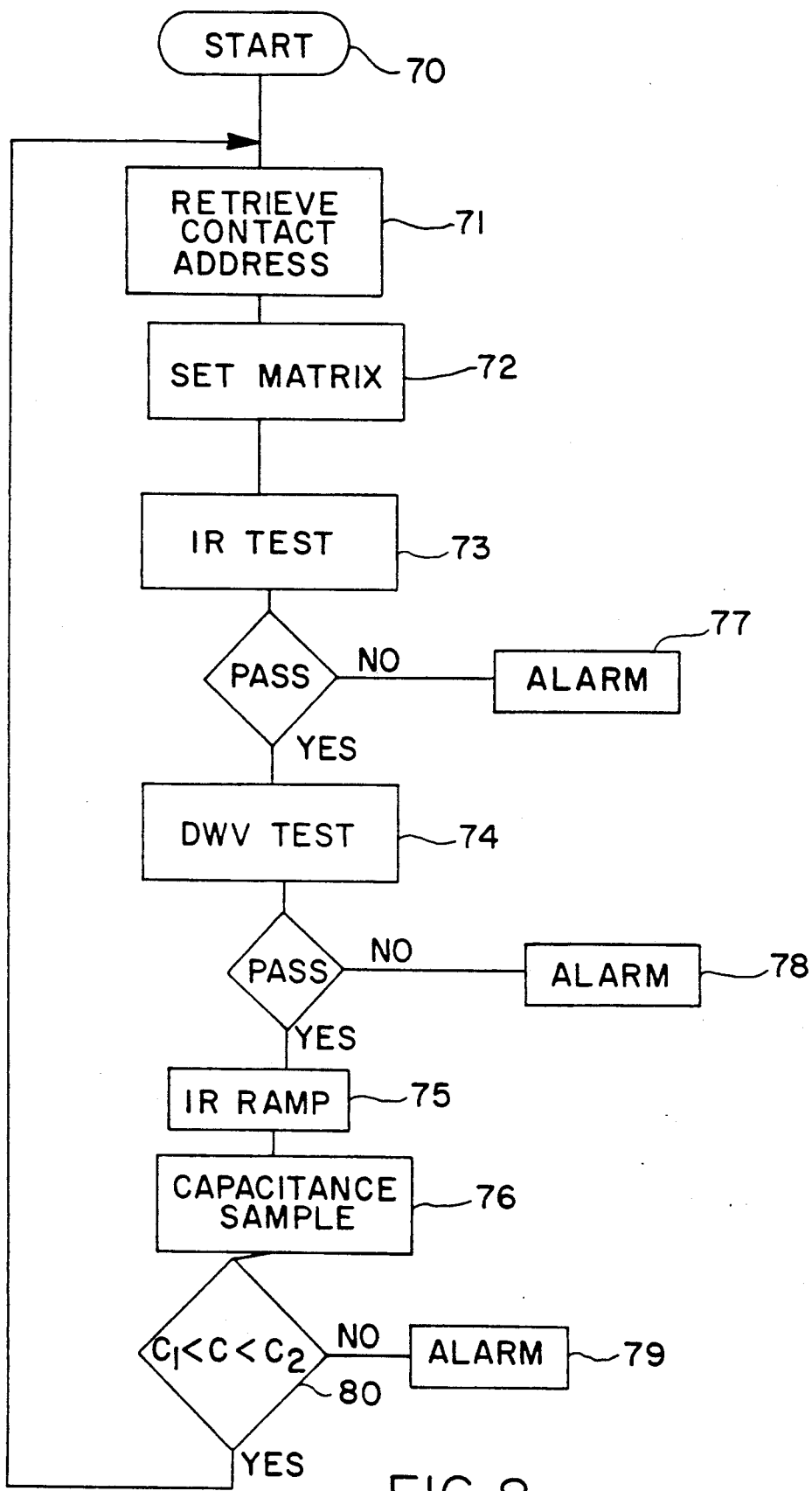
FIG. 8 is a flow chart illustrating the control functions executed by the on-board computer 20 of FIG. 2.

Having thus generally described the system block diagram of a preferred embodiment of the invention, the specific test routine in accordance with the preferred embodiment may be understood with reference to FIG. 8.

FIG. 8 is a flow chart illustrating the sequence of routines executed by the on-board computer 20 to obtain complete testing of each pin of a connector 3. When the operator has placed cover 11 in its operational position, the operator closes a start switch (not shown) which is detected by the on-board computer 20 in step 70. In step 71, the addresses are received from the configured on-board computer 20 to identify the contacts of the spring contact backplane of the test bed 12, which are connected to the cells containing connectors under test. With the given connector type identified from the host computer 25, as preconfiguration data is downloaded to the on-board computer 20, the on-board computer 20 establishes connections for the switching matrix 14. The switching matrix 14 is configured in step 72 so as to apply for each sequentially tested connector, a high voltage potential to all but a single pin under test, as well as the connector shell. For a given connector type, the contact addresses are derived by the on-board computer 20 for each cell interfacing with the spring contact backplane 12. As part of a configuration subroutine, scaling parameters are transferred to the electrometer 16 to set the internal gain factors for the amplifiers of the electrometer 16 for an expected leakage current level. As the levels of current to be detected will vary in accordance with the applied potential, different gain factors are provided in a table of the on-board computer 20 for measuring an expected leakage current level.

In the preferred embodiment of the invention, three tests are carried out on each connector 3. The tests are performed on each pin, with the remaining pins connected together and a voltage applied between the remaining pins and the common connection of the electrometer. The electrometer 16 input terminal is connected to the unenergized pin. The leakage current path is provided from the high voltage source to the energized pins and shell through the unenergized pin and electrometer to the common connection of the high voltage source. These tests include an insulation resistance test 73, a dielectric withstanding voltage test 74, as well as a measurement of the capacitance 76 of a given pin by applying a voltage ramp function to the plurality of energized pins in step 75. A failure of any one of these tests will produce an alarm indication 77, 78, 79 which is the setting of a status flag identifying the test which failed, as well as the particular connector and pin which tested as a failure. This information is conveyed via the RS232-C interface to the host computer 25 where it may be displayed identifying failed components, and particular pins of a failed component, which did not meet the test requirements. Additionally, the failed connector and respective pin producing the failure will be identified on the display 19 of the on-board computer 20.

Figures 9, 13:
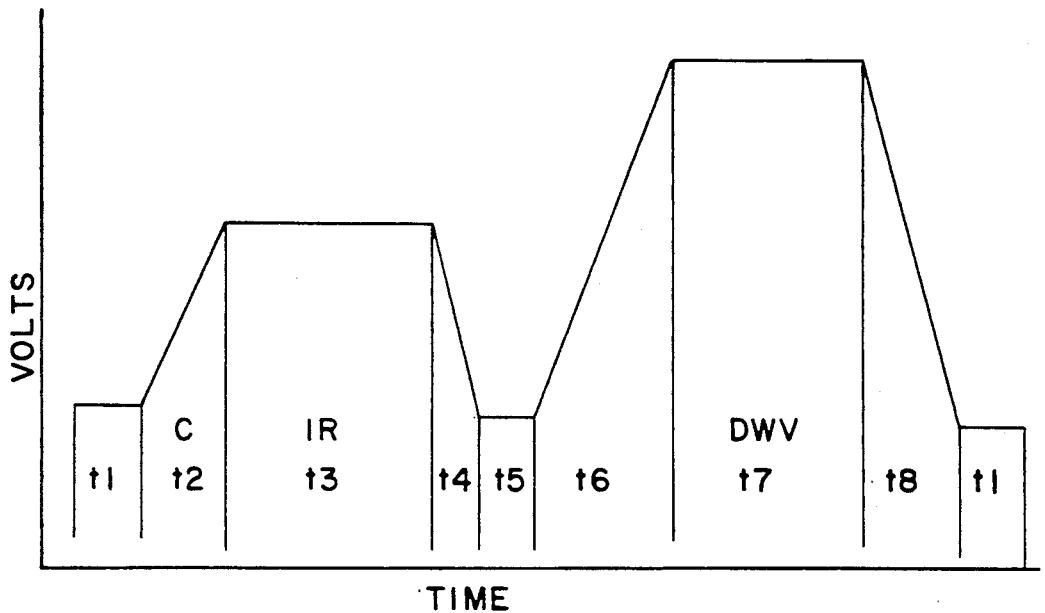
FIG. 9 illustrates voltage waveforms capable of being produced from the high voltage source 18 during a test sequence for the device of FIG. 2.
FIG. 13 shows the display produced by the host computer for configuring the tester.

FIG. 9 illustrates a sequence of time intervals, during which one pin of a connector under test is completely tested. The Figure represents the voltage potential applied to all but the one pin connected to the electrometer 16. A zero-voltage interval TI is provided to permit addressing and setting of ranges and scaling to a newly selected plurality of pins. During a time interval represented by T2, the voltage potential increases as a linear function to a first steady state value, identified by time interval T3. During the time interval T2, the capacitance between the plurality of pins and shell receiving the high voltage and the pin connected to the electrometer 16 may be determined. Recognizing that the leakage current is proportional to the capacitance $C \times dv/dt$, i.e., the slope of the voltage curve represented in time interval T2, permits a rapid accurate calculation of the capacitance between the pin under test and the remaining energized pins and shell. During the time interval T3, a potential is applied which will produce a current identifying the insulation resistance between the pin producing a measuring current and the remaining energized pins and shell. The current measured by the electrometer 16 during time interval T3 may be digitized, and compared against a current level stored in RAM associated with the given connector type, for determining whether or not a failure has occurred. Those skilled in the art will recognize that these currents represent resistance values and may be conveniently displayed as an insulation resistance by the host computer 25.

FIG. 9 illustrates additional ramp voltage functions occurring in intervals T4 and T6. It is possible to measure capacitance and verify the same during these intervals as well, taking advantage of the ramp function of the applied voltage. Time interval T7 represents the dielectric withstanding voltage (DWV) test. During the time interval T7, a potential is applied, producing a measuring current which is digitized and compared against a current level stored in RAM for determining whether or not a failure has occurred.

During the capacitance measurement interval, which may also be during the ramp interval identified by times T2, T4, T6, T8, the value of measured capacitance can be determined at any DC voltage and is compared by step 80 of FIG. 8 with a first and second limit also identified with respect to a specific connector type.

Failure of any one of these test conditions will be reported to the host computer 25, along with a display with the malfunctioning connector identification. A visual indication of the malfunction is also presented on display 19.

Experience using the foregoing device has shown that certain refinements may be made, particularly to the insulation resistance (IR) and dielectric working voltage (DWV) tests, which will discriminate apparent failures from actual true failures. In this refined IR test, if the determined resistance from the first sampled current during the IR test is less than the stored fail limit value of IR resistance, a failure message is generated and displayed on display 19, and reported to computer 25. If the number is equal to or greater than the stored fail limit, the number is stored in memory. Following a time interval, since the first IR value was stored, a second sample of IR test current is taken by the electrometer and the representative insulation resistance compared with both the stored fail limit insulation resistance and the first stored insulation resistance measurement.

The second stored value of insulation resistance is compared with the RAM fail limit insulation resistance and, if it is less than the fail limit, a failure message is generated and displayed. If the second stored current value is equal to or greater than the stored first measured value, the IR testing is concluded and the second, reading is presented for display as the actual validated insulation resistance.

In the event that the second measured value of current produces an insulation resistance which is less than the first measured value, but not less than the fail limit value, then additional IR test samples are obtained and an insulation creep test is performed from the first and second measurements of resistance.

The creep test provides a basis for predicting a failure in the insulation resistance test, with a maximum resistance creep rate $-NCR_{max}$, and a minimum resistance creep rate $-NCR_{min}$. The slope of the function respecting first and second measured insulation resistance values $R_1$, $R_2$, and third and fourth measured values $R_3$, $R_4$, are compared to the maximum and minimum creep rates to predict an eventual resistance failure.

The first two measured values $R_1$ and $R_2$ represent a line segment having a slope of:

$$\frac{R_2 - R_1}{t_2 - t_1}$$

where $t_2 - t_1$ is the time between resistance measurement values. This slope, or creep value, is compared with the maximum creep value $NCR_{max}$.

If the comparison determines that the creep value is greater than $NCR_{max}$, subsequent creep values are determined for measured resistance pairs $R_2$, $R_3$ and $R_3$ and $R_4$. The creep value for resistance measurements $R_2$, $R_3$ is determined as $$\frac{R_3 - R_2}{T_3 - T_2}$$

The creep value 3, 2 is compared with a fraction such as one half of the creep value 1, 2. If it is less than the compared value, yet another creep value is determined from measured resistance values $R_3$, $R_4$ as $$\frac{R_4 - R_3}{t_4 - t_3}$$

This creep value 4, 3 is compared with $-NCR_{min}$ to determine whether the insulation resistance is changing at a rate which will result in a failure within a known time interval. If the creep value 4,3 does not exceed $-NCR_{min}$, a failure for the pin under test is posted for the IR test. If any one of the foregoing creep values meet or exceed a compared value, the pin is validated as good, and the subsequent pins are tested until all pins have been tested.

The underlying purpose for all of this "creep" test is to save substantial time.

Figure 10A:
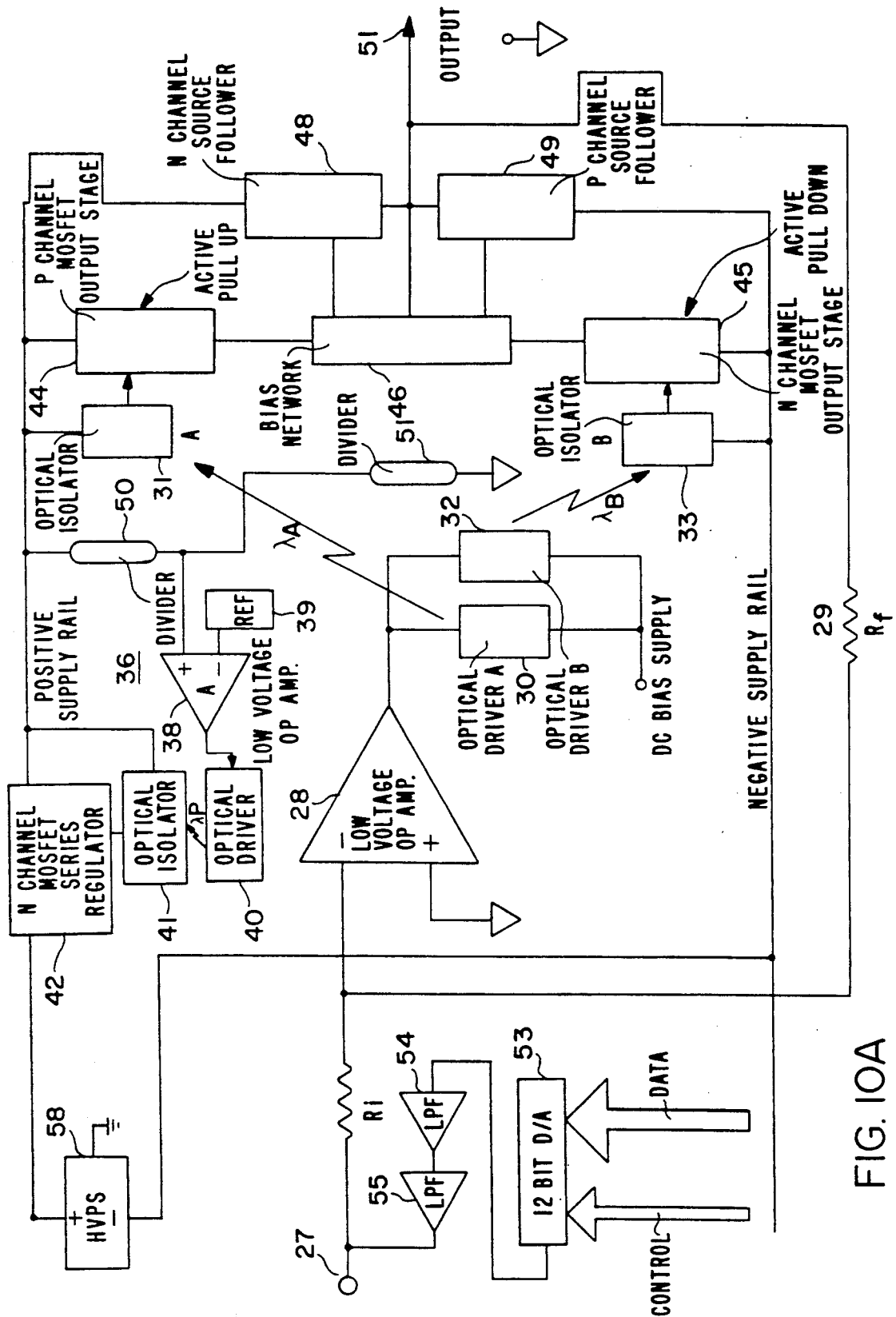
FIG. 10A illustrates the high voltage source including a high voltage operational amplifier for the device of FIG. 2.
Figure 10B:
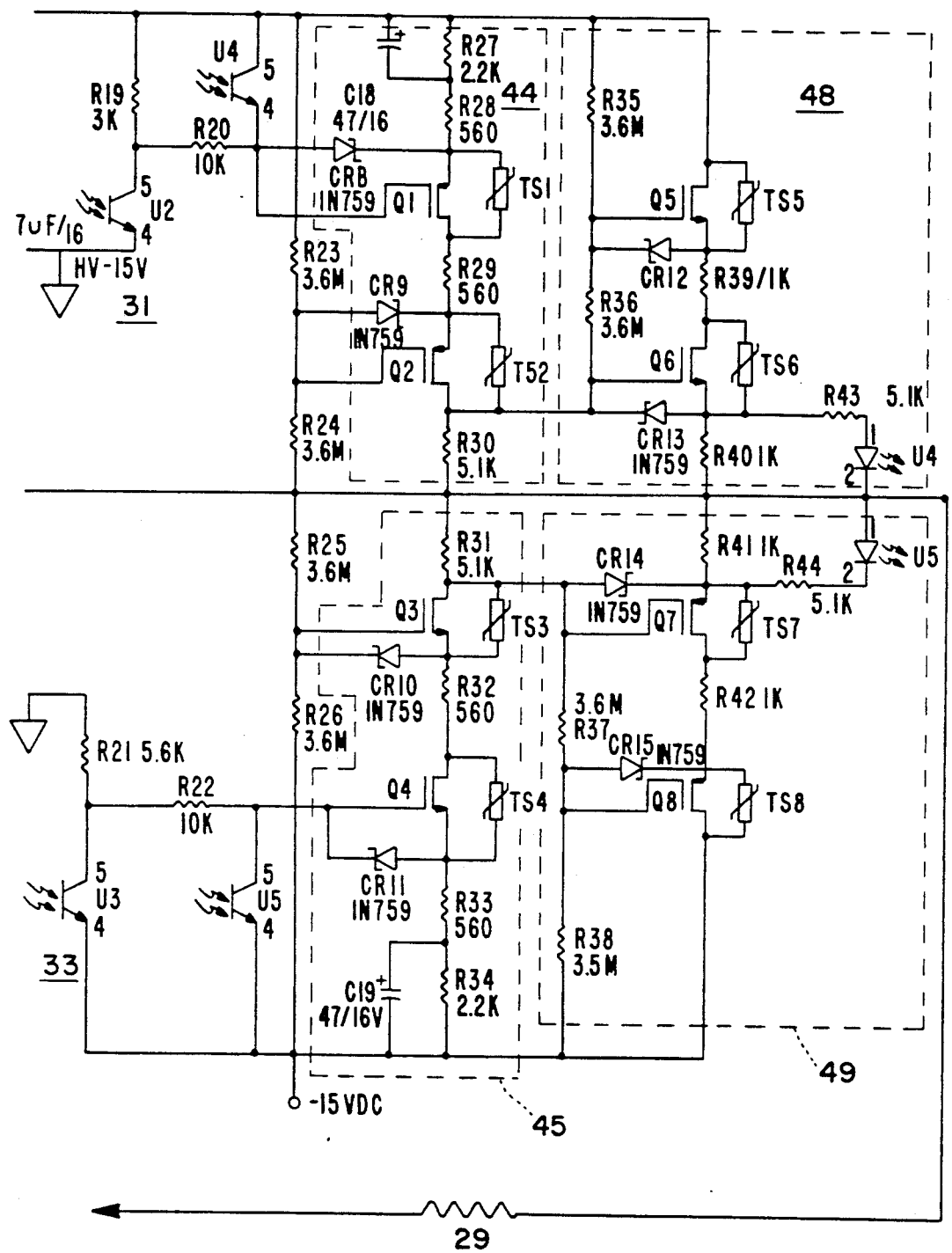
FIG. 10B illustrates the output circuit stages for the high voltage operational amplifier of FIG. 10A.

In order to apply the voltage potentials to the different groups of pins which are energized in testing a connector, a high voltage generator, such as is shown in FIG. 10, is employed. As was noted with regard to prior art devices, connectors having bypass capacitors associated with each pin member require time in order to charge to a full potential. In order to provide a low impedance charging source, the high voltage operational amplifier of FIG. 10 is employed. The high voltage operational amplifier is connected to a high voltage power supply 58, which may produce + and − voltage potentials of up to 1500 volts and higher, any value therebetween being selectable for application to the connector pins. The value of voltage to be generated is received in a 12 bit digital to analog converter 53 from the on-board computer 20. The 12 bit digital to analog converter 53 will provide an analog voltage level proportional to the desired output potential.

By continuously updating the 12 bit digital to analog converter 53, any voltage function may be produced, including the aforesaid linear ramp function, a sinusoidal function from a sine table stored within the on-board computer 20, or any other time varying function. The resulting analog voltage level for setting the output voltage is filtered in two low pass filter sections 54 and 55, before being applied to the input 27 of a low voltage operational amplifier 28. The low voltage operational amplifier 28 is optically coupled via optical drivers 30 and 32 to optical receivers 31 and 33. The optical receivers 31 and 33 apply signals to an active pullup and active pull-down circuit 44 and 45, shown more particularly in FIG. 10B. The active pull-up circuit 44 is a P-channel MOS output stage, and the active pull-down circuit is an N-channel MOS FET output stage 45. Each of these stages are connected through biasing network 46 to an N-channel source follower 48 and a P-channel source follower 49. The optical coupling between low voltage and high voltage sections avoids any possibility of direct coupling a high voltage to a low voltage circuitry. A feedback resistor 29 is shown, rendering the device an operational amplifier having inverting feedback.

A series regulator 42 is shown in the positive supply rail connected to the high voltage power supply 58. The series regulator is controlled through an optical isolator 41, and optical driver 40. A reference voltage 39 is derived from conventional Zener diode reference levels, and compared with the divided potential provided by divider 50 and 51. The comparator amplifier 38 will provide a control signal through the optical coupling device to control the DC output voltage supplied by the series regulator 42.

The high voltage output 51 is applied to the switching matrix which identifies which group of pins are to receive a high voltage signal level. The operational amplifier of FIG. 5 will rapidly charge each of the groups of pins and shell under test to avoid lengthy waiting times for pin voltage potentials to reach their final value.

Figures 11A, 11B:
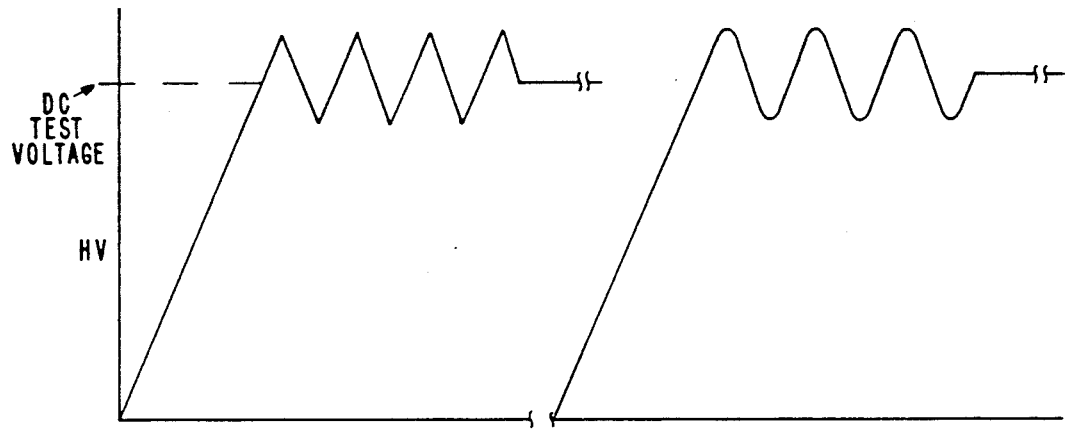
FIG. 11A illustrates an applied DC test voltage having a triangular wave function imposed thereon.
FIG. 11B illustrates an applied test voltage having a sinusoidal function imposed thereon.
Figures 11C, 11D:
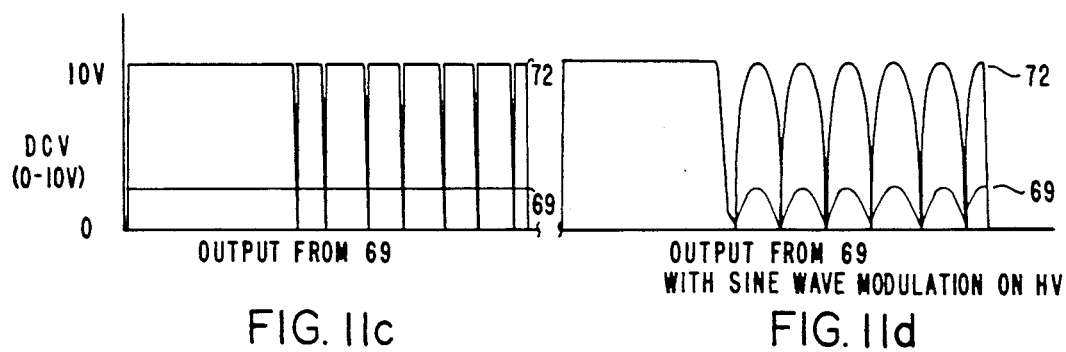
FIG. 11C illustrates the detected current resulting from the wave applied voltage of FIG. 11A.
FIG. 11D illustrates the resulting detected current from the application of the applied voltage of FIG. 11B.

The high voltage generator of FIG. 10 permits the testing of connector pins at various voltage potentials. As is illustrated in FIGS. 11A, 11B and 11C, the possibility of applying voltage potentials for measuring the capacitance at different voltage potentials is present. As will be clear from FIG. 11H, the capacitance of many connector pins will change as much as 60% as the voltage between the pin under test and the remaining pins and shell changes. By changing the potential at which a capacitance measurement is made, it is possible to verify whether the capacitance for these various voltage levels is within specification. The utility of the voltage waveforms of FIGS. 11A and 11B will be apparent from the following.

Figure 12:
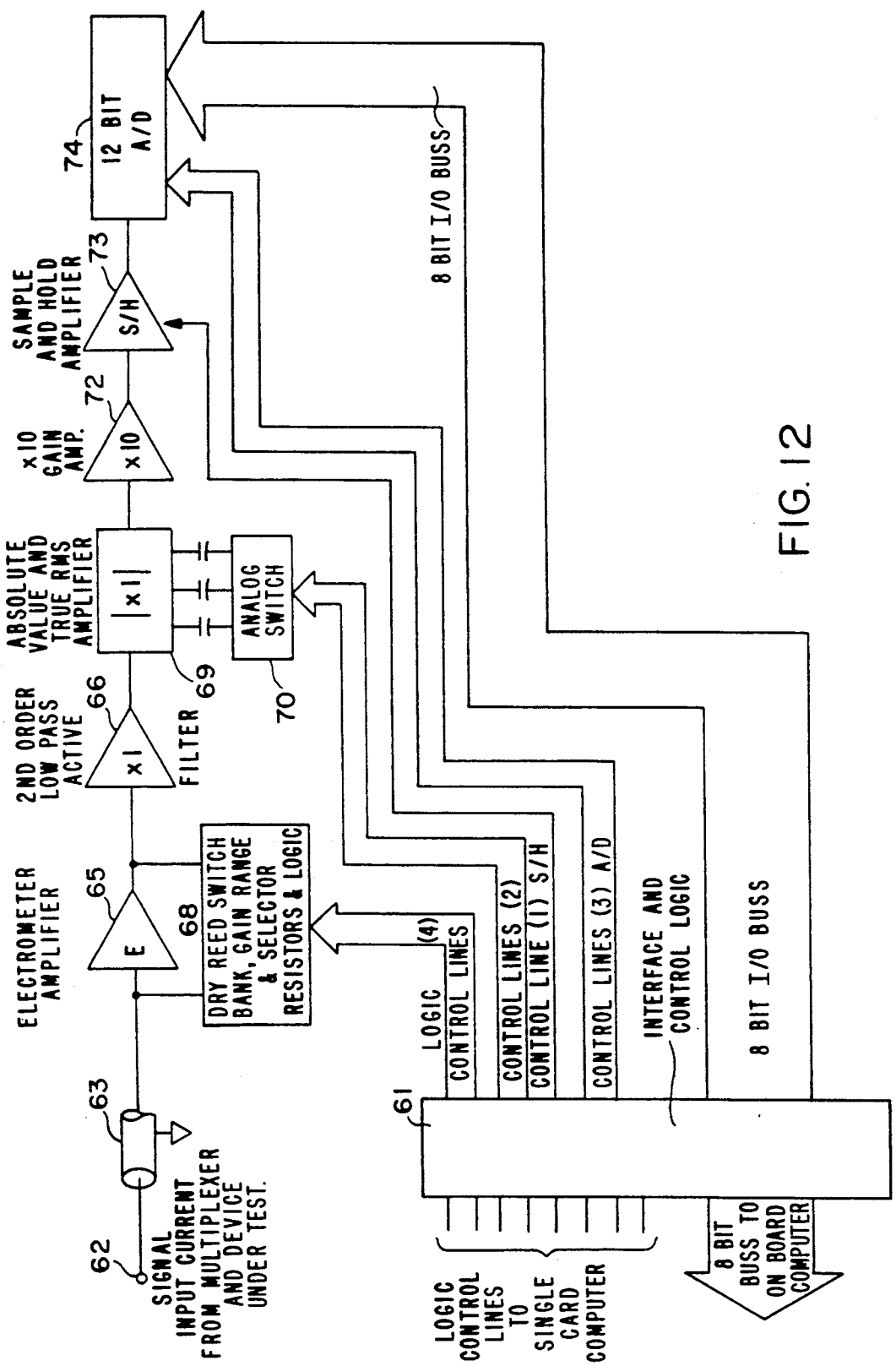
FIG. 12 illustrates the electrometer used to sense leakage current signals between pins of the connector under test.

FIG. 12 is a block diagram of a preferred embodiment of an electrometer for sampling current received from a pin of the connector under test. The individual pin in which a signal current is being measured is connected to the electrometer of FIG. 12. The current is received via the switching matrix on terminal 62. The shielded cable 63 is employed to keep the noise level associated with the signal to a minimum. A first amplifier 65 has a programmable gain function, identified by block 68. By virtue of a control signal received on the interface and control logic 61, the gain of amplifier 65 may be set in accordance with an expected leakage current level for a given applied voltage potential. A second order low pass active filter 66 filters the signal produced by amplifier 65. The absolute value and true RMS amplifier 69 also includes an analog switch 70 which may be set via the interface and control logic 61, varying the function of amplifier 69. These functions may be either a straight DC measurement or true RMS measurement for AC current measurements. By specifying the test conditions, the values of these parameters may be downloaded from the microprocessor controller 20 to set the control factors associated with these devices.

A second amplifier 72 is shown, having a nominal gain of 10 applying the absolute value signal to the sample and hold amplifier 73. The sample and hold amplifier 73 will, under control of the signals received by the interface and control logic 61, control the sampling interval to sample the absolute value of a sensed current. A 12-bit analog-to-digital converter 74 digitizes the sampled value and provides the digitized value to the 8-bit I/O bus. The 8-bit I/O bus is accessible by the on-board computer 20 to read the value of measured current at any interval programmed into the on-board computer.

Figures 11E, 11F:
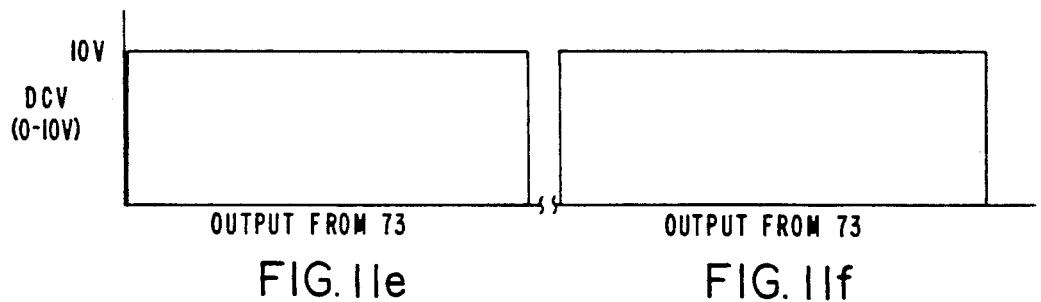
FIG. 11E illustrates the sampled output from amplifier 73 when the test voltage of FIG. 11A is applied to a plurality of connector pins.
FIG. 11F illustrates the sampled output current when the voltage function of FIG. 11B is applied to the plurality of connector pins.

FIGS. 11C and 11D illustrate the detected current produced by amplifier 69 when a test voltage is applied in accordance with FIGS. 11A and 11B. As the capacitance is a function of the measured current and applied voltage derivative dv/dt, the sampled value from the absolute amplifier 69, represented in FIG. 11C, is proportional to the slope of the applied potential of FIG. 11A. A triangular test voltage which experiences linear voltage transitions is illustrated in FIG. 11A, in which the sampled current is a constant magnitude for each of these linear voltage segments. The sampled output from sample and hold amplifier 73 is illustrated in FIG. 11E for each of these linear voltage segments. The sampled output voltage is therefore proportional to the capacity of the unenergized pin under test at that DC bias or test voltage.

Similarly, an exact (via D/A) sinusoidal function applied to a constant test voltage is illustrated in FIG. 11B. The sinusoidal function at the zero crossing value has an exact linear slope. By sampling the output signal from absolute value amplifier 69, at the zero crossing level, a value is obtained proportional to the capacitance exhibited by the pin under test. The output from the sample and hold amplifier 73 represents the peak current detected from amplifier. 69, representing the capacitance for the pin under test.

Figure 11H:
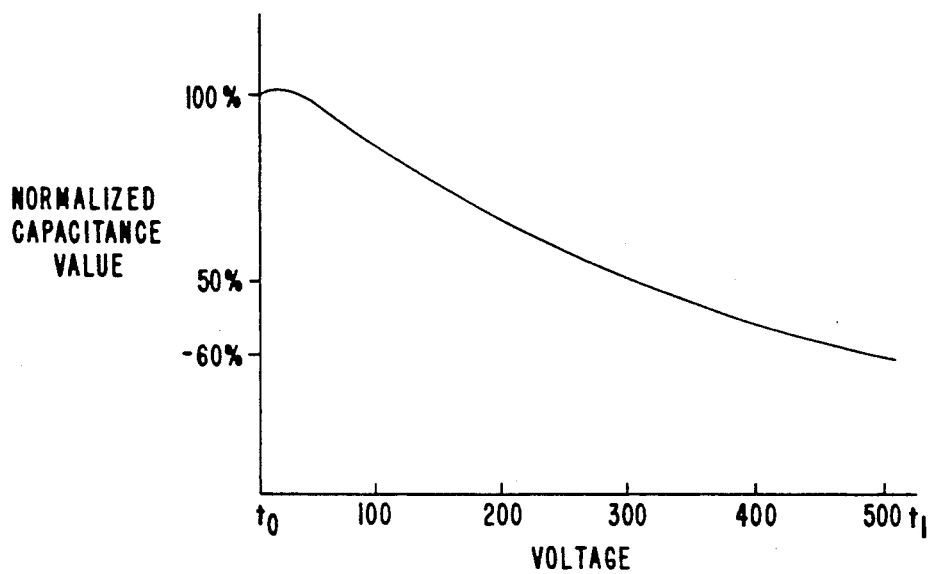
FIG. 11H illustrates the effects that the level of DC voltage from the DC applied voltage of FIG. 11G has on the measured capacitance of a connector pin fabricated from a barium titanate material.
Figure 11G:
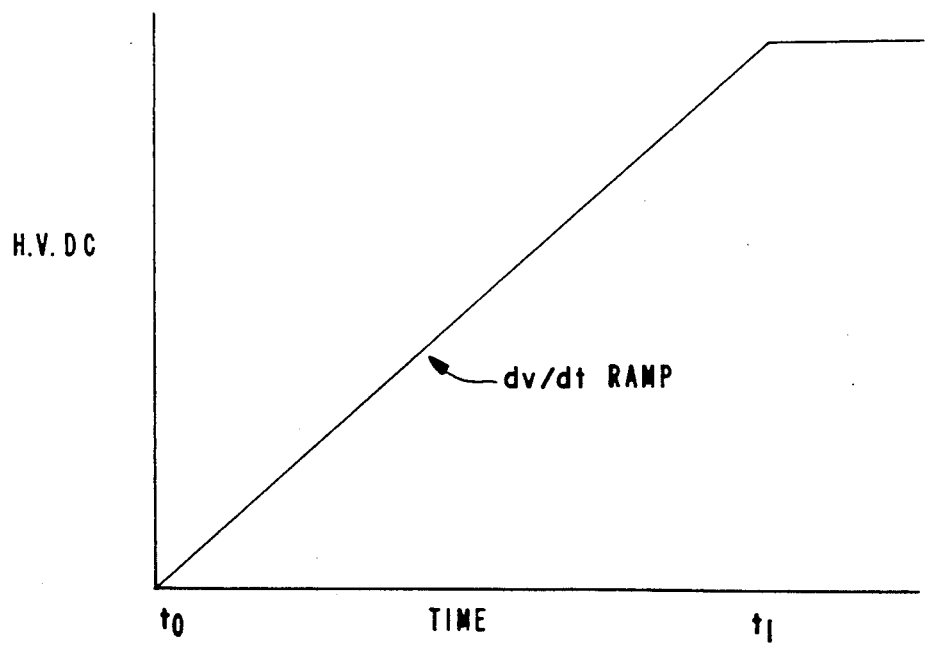
FIG. 11G illustrates a linearly-changing voltage ramp applied to a plurality of pins of a connector under test.

By applying a voltage potential as shown in FIG. 11G, it is possible by sampling (73) to make capacitance measurements at various points along the voltage ramp voltage so as to reproduce the normalized capacitance value, shown in FIG. 11H.

The voltage and signal functions represented by FIGS. 11A through 11H are illustrative of the various testing schemes which may be configured using the test device of FIG. 1. The ability to apply a voltage function of any time-varying configuration, as well as the ability to sense resulting currents, and digitize the same, permit analysis of any connector under test using various test conditions and criteria.

Having thus described the circuitry for applying a controlled high voltage potential to a plurality of pins and shell of a connector under test, and circuitry for measuring any resulting leakage current on an adjacent non-energized pin, attention will now be directed to providing a convenient user interface for setting up automatic testing of connectors.

To configure the testing device, a host computer 25 is provided to download test cell configurations and test conditions and test criteria to the on-board computer 20. When the cell 17 is installed bearing a connector receptacle for a given connector type, the location of each connection of the cell with relation to the spring contact backplane 12 is configured by identifying with the cell the number of pins to be tested. The address of the spring contacts of the backplane are identified from this information to the on-board computer 20. During testing, the on-board computer 20 addresses these contacts through switching matrix 14 to permit energizing of the connector pins, and reading current from an unenergized pin.

The program of the host computer 25 presents a menu to identify the cells as shown in FIG. 13. Each identified cell receives a connector part number for the selected carrier to be installed in the test bed. This information is used to configure the switching matrix to identify the appropriate spring contacts of the backplane 12.

Once the part number identifying a particular cell configuration to be tested is identified within the carrier, by typing the part number, the test parameters for the connector type previously stored in host computer 25 are selected and entered in a subsequent screen displayed by host computer 25.

These parameters correspond to the previously described parameters which relate to the particular connector selection. They may be summarized as follows:

| | |
|---|---|
| IR Voltage | test voltage for insulation resistance test; |
| IR Fail Limit | minimum insulation resistance; |
| IR Sample Mode | either one sample or multiple samples for IR creep test; |
| IR Dwell Time | established (determined by operator) time test voltage is applied for IR test; |
| DWV Voltage | test breakdown voltage; |
| DWV Fail Limit | maximum allowed current value for DWV test; |
| DWV Sample Mode | either one sample, or multiple samples for DWV creep test; |
| DWV Dwell Time | established (determined by user) time voltage is applied for DWV test; |
| Min. Capacitance Fail Limit | minimum allowed (determined by user) pin capacitance; |
| Maximum Capacitance Fail Limit | maximum allowed (determined by user) pin capacitance; |
| Capacitance Test Mode | either static (less than 1 volt RMS) or dynamic (at a programmed voltage), or both |
| Capacitance Sample Points | sample voltage where instantaneous current is sampled to compute C. |

These parameters having been loaded into storage tables of the host computer are downloaded to the on-board computer 20. The host computer displays a command to START TEST once cover 11 is closed on the device, and testing begins.

The on-board computer 20 will then apply the various test conditions downloaded from host computer 25 to the connectors under test. The resulting currents which flow from the energized pins to the pin which is connected to the electrometer is measured and compared with the various test criteria.

The on-board computer stores the results of each test performed for each pin tested of every connector tested. The host computer may access and display the data as shown in FIG. 14.

Figures 14, 15:
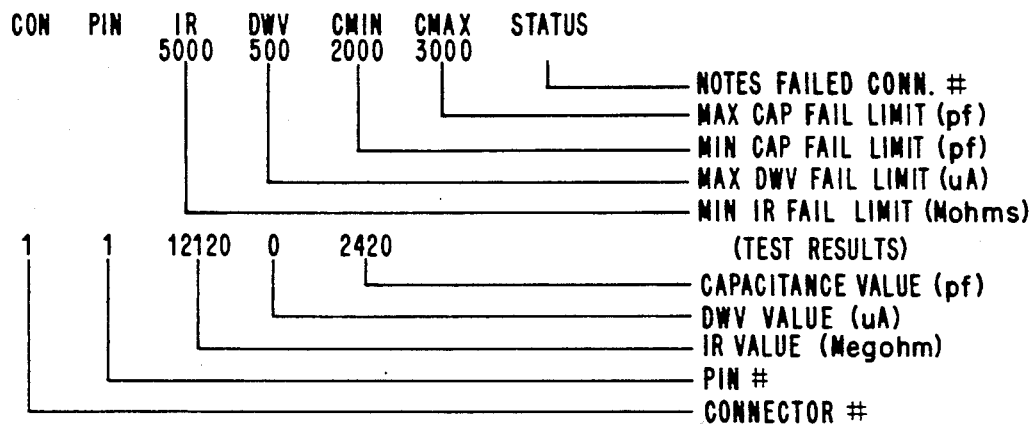
FIG. 14 illustrates a display produced by the host computer of the test criteria configured for a connector under test.
FIG. 15 illustrates a display of the actual test results for a connector under test reported to the host computer 25.

When on-board computer 20 finds a measured current value does not meet the test conditions downloaded from host computer 25, an error message of FIG. 14 is posted back to host computer 25. The message indicates in a status column the failed connector number, as well as the related test parameters and actual measured parameter, and the pin which produced the failed test condition.

The data for all tested conrecors, whether failed or passed, is available to the operator at his selection to permit the analysis of all connectors tested, including those which passed all testing criteria and those which failed. All test data which is obtained is forwarded to the computer 25 for later analysis. The valid test data is displayed in a format similar to the failed connector message, as shown in FIG. 15, at the selection of the operator.

The compilation of the test data may be in any manner selected by a skilled programmer. Additionally, once the data is available in host computer 25, statistical and quality control analysis may be conducted to isolate process defects.

The foregoing technique for displaying tests results is exemplary. Printing of results, as well as formatting other display formats, is possible.

What is claimed is:

1. A device for testing multi-pin connectors comprising:

a high voltage operational amplifier circuit having a voltage input, and an output for producing a high voltage which changes linearly with linear changes of an input voltage signal;

a switching matrix for applying a high voltage from said high voltage operational amplifier to a plurality of pins on a connector being tested;

an electrometer connected to detect a current flow between said plurality of pins receiving said high voltage and one remaining pin not receiving said high voltage; and, means for determining when said current flow exceeds a maximum predetermined amount.

2. The device of claim 1 further comprising:

means for supplying a time varying ramp voltage to said high voltage operational amplifier circuit input, whereby a linearly charging high voltage is applied to said plurality of pins; and, means for measuring the change in voltage appearing between said one remaining pin and a plurality of pins, and determining from said current flow and change in voltage a value of capacitance associated with said remaining pin.

3. The device of claim wherein said high voltage operational amplifier comprises:

a low voltage operational amplifier;

a P-channel FET pull-up, circuit connected to a positive terminal of a high voltage power supply, and to an input of an N-channel source follower, said N-channel source follower connected to supply a current from said positive terminal to said plurality of pins;

an N-channel FET pull-down circuit connected to a negative terminal of a high voltage power supply, and to an input of a P-channel source follower, said P-channel source follower connected to a supply or current from said plurality of pins to said negative terminal of said high voltage power supply;

a feedback resistor connected between an input of said low voltage operational amplifier and said plurality of pins; and, means for optically coupling said low voltage operational amplifier output to inputs of said pull-down and pull-up circuits.

4. A device for testing connectors comprising:

a high voltage generator for supplying a test voltage in accordance with a digital signal from an on-board computer, including:
 (a) a digital-to-analog converter for receiving digital signals representing a voltage level to be produced;
 (b) a high voltage operational amplifier connected to a source of high voltage, producing an output voltage proportional to a voltage produced by said digital-to-analog converter;

a switching matrix receiving said operational amplifier output voltage, and sequentially applying said voltage to different groups of pins of a connector being tested;

an electrometer connected to a pin of said connectors, which is not receiving a high voltage, for measuring a current flow from a group of pins receiving said high voltage, producing a digital value of a measured current; and, an on-board computer programmed to apply a time varying digital signal to said high voltage generator, and receive a digital value of said measured current in response thereto, and comparing said digital value with a stored criteria indicating a failure.

5. The device of claim 4 wherein said on-board computer computes a value of capacitance associated with a measured current.

6. The device of claim 5 wherein said time varying voltage is a linear ramp function.

7. The device of claim 4 wherein said on-board computer supplies a switching command to said switching matrix, identifying a group of pins of a connector to receive a voltage.

8. The device of claim 4 wherein said electrometer comprises:

a first amplifier having a gain controlled by a command received from said on-board computer;

an absolute value amplifier connected to receive a signal from said first amplifier; and, an analog-to-digital converter to convert a signal from said absolute value amplifier to a digital value of measured current.

9. A device for testing connectors comprising:

a high voltage generator for supplying a selected value of high voltage in response to a digital command;

a switching matrix for supplying said high voltage to groups of pins of a connector being tested, said groups of pins being selected in response to a digital command;

an electrometer connected to a remaining pin of said connector being tested to produce a digital signal representing the magnitude of a current flowing between said remaining pin and group of pins;

an on-board computer programmed to generate commands for said high voltage generator and switching matrix, said on-board computer receiving in response to each group of pins selected to receive a high voltage, a value of measured current from said electrometer, and determining from said value of current the presence of a defect condition for said connector.

10. The device according to claim 9 wherein said on-board computer is programmed to provide commands to said high voltage generator, which results in a linearly changing high voltage being applied to said group of pins, and is further programmed to determine from said electrometer measured current, a value of capacitance.

11. The device according to claim 9 wherein said on-board computer is programmed to provide first and second high voltage levels to said group of pins for first and second subsequent time intervals.

12. The device according to claim 9 wherein said on-board computer is programmed to perform the steps of:

supplying a command to said high voltage generator for producing a programmed test voltage;

sampling said electrometer current value after a predetermined time delay following said high voltage generator producing said test voltage;

storing a first measured value of said electrometer measured current following said time delay; and, comparing said first measured value with a predetermined fail limit current reading stored in said on-board computer to determine whether a failure has occurred.

13. The device according to claim 12 further comprising:

storing a second value of said electrometer measured current;

comparing said second value with said fail limit current, whereby a failure condition is determined; and, if a failure condition is not determined from comparing said second value with said limit, comparing said second value with said first value to determine whether a connector failure is in progress.

14. The device according to claim 13 wherein said on-board computer is further programmed to compute the change in measured current over time, and comparing said current change with a predetermined current creep factor, and determining from said comparison whether or not a failure exits.

15. The device of claim 14 wherein a failure is determined by said on board computer to be in progress from said change in measured current.

16. A device for testing a multiplicity of cable plugs comprising:
   a test cell supporting on one side thereof a receptacle for receiving a cable plug having a particular configuration, and having a plurality of connection points on an opposite side connected to each pin of said plug;
   a carrier for supporting a plurality of test cells;
   a test bed for receiving said carrier, said bed including a plurality of contact points contacting each connection point of a facing test cell; and,
   a matrix circuit connected to each of said contact points for individually addressing each pin of said connector, and connecting a voltage to some of said connector pins while delivering a current from another of said pins to an electrometer.

17. The device of claim 16 wherein said carrier is configured to receive cells of different size, which support receptacles with receive connectors having different pin configurations.

18. The device of claim 17 further comprising:
   an on-board computer programmed to identify a test sequence for each connector type being tested, and for applying address signals to said matrix circuit for identifying groups of said connector pins for receiving a high voltage potential, and one of said pins for connecting to an electrometer;
   a high voltage generator connected to said matrix; and,
   an electrometer connected to said matrix for receiving a current from a pin of said connector, whereby under control of said on-board computer different groups of pins receive a high voltage and a leakage current from each of said pins not receiving a high voltage is monitored.

* * * * *